United States Patent
Matsuda

(10) Patent No.: US 8,928,013 B2
(45) Date of Patent: Jan. 6, 2015

(54) ORGANIC ELECTROLUMINESCENCE DEVICE AND MULTI-COLOR DISPLAY APPARATUS USING THE SAME

(75) Inventor: Yojiro Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 282 days.

(21) Appl. No.: 12/900,562

(22) Filed: Oct. 8, 2010

(65) Prior Publication Data

US 2011/0114973 A1    May 19, 2011

(30) Foreign Application Priority Data

Nov. 17, 2009  (JP) .................................. 2009-261748

(51) Int. Cl.
*H01L 51/50* (2006.01)
*H01L 51/52* (2006.01)

(52) U.S. Cl.
CPC ........ *H01L 51/5253* (2013.01); *H01L 51/5265* (2013.01); *H01L 2251/558* (2013.01)
USPC ............... 257/89; 257/98; 257/313; 257/504; 257/509; 257/E51.018; 257/E51.022

(58) Field of Classification Search
USPC .............. 257/89, 98, 313, 504, 509, E51.018, 257/E51.022
See application file for complete search history.

(56) References Cited

U.S. PATENT DOCUMENTS

| | | | |
|---|---|---|---|
| 5,405,710 A * | 4/1995 | Dodabalapur et al. | 428/690 |
| 6,639,580 B1 | 10/2003 | Kishi et al. | |
| 8,022,620 B2 | 9/2011 | Kobayashi | |
| 8,384,102 B2 | 2/2013 | Michellys | |
| 2006/0113907 A1 | 6/2006 | Im et al. | |
| 2009/0218943 A1 * | 9/2009 | Nishimura et al. | 313/512 |
| 2011/0042696 A1 * | 2/2011 | Smith et al. | 257/89 |

FOREIGN PATENT DOCUMENTS

| | | |
|---|---|---|
| CN | 1797810 A | 7/2006 |
| CN | 101527350 A | 9/2009 |
| JP | 59-050401 A | 3/1984 |
| JP | 07-161474 A | 6/1995 |
| JP | 08-008061 A | 1/1996 |
| JP | 3170542 B2 | 5/2001 |
| JP | 2006-156390 A | 6/2006 |
| JP | 2008-210740 A | 9/2008 |
| JP | 2009-211860 A | 9/2009 |
| JP | 2009-211877 A | 9/2009 |
| JP | 2010-092855 A | 4/2010 |
| KR | 10-2009-0094745 A | 9/2009 |
| WO | 2006/013373 A2 | 2/2006 |
| WO | 2009/116531 A | 9/2009 |

OTHER PUBLICATIONS

Chinese Office Action dated Jul. 2, 2012, in related corresponding Chinese Patent Application No. 201010541906.6 (with English translation).
Korean Office Action dated Sep. 18, 2012, in corresponding Korean Patent Application No. 10-2010-0111284.
Chinese Office Action dated May 28, 2013, in related Chinese Patent Application No. 201010541906.6 (with English translation).
Chinese Office Action dated Jan. 29, 2013, in related Chinese Application No. 201010541906.6 (with English translation).

* cited by examiner

*Primary Examiner* — William F Kraig
*Assistant Examiner* — David Spalla
(74) *Attorney, Agent, or Firm* — Fitzpatrick, Cella, Harper & Scinto

(57) ABSTRACT

An organic electroluminescence device includes a first electrode, a second electrode located on a light extraction side and having a metal film, and an organic compound layer provided between the first electrode and the second electrode and including an emission layer. In addition, a first inorganic protective layer is in direct contact with the second electrode and has a specified thickness.

8 Claims, 1 Drawing Sheet

ORGANIC ELECTROLUMINESCENCE DEVICE AND MULTI-COLOR DISPLAY APPARATUS USING THE SAME

BACKGROUND OF THE INVENTION

1. Field of the Invention

The present invention relates to an organic electroluminescence (hereinafter, referred to as "EL") device applied to a flat panel display, a projection display, and an illumination device, and to a multi-color display apparatus using the organic EL device.

2. Description of the Related Art

Organic EL devices using electroluminescence of an organic material have been actively researched and developed. Of the organic EL devices, a top emission type organic EL device (in which substrate, reflective electrode, organic layer, and transparent electrode are laminated in order to emit light in this lamination direction) capable of preventing aperture ratio loss caused by wirings and thin film transistors (TFTs) is becoming mainstream.

However, an organic EL material is sensitive to moisture, and hence a structure in which a protective layer is formed has been proposed to improve reliability. A protective layer which is located on an upper electrode and contains silicon, oxygen, or nitrogen is disclosed in Japanese Patent Application Laid-Open No. H07-161474. In order to improve light extraction efficiency in the top emission type organic EL device, a technology of defining a refractive index and thickness of an organic capping layer located on an upper electrode is disclosed in Japanese Patent Application Laid-Open No. 2006-156390.

However, when a thickness of the protective layer disclosed in Japanese Patent Application Laid-Open No. H07-161474 is to be set to enhance light having a desired wavelength, to thereby obtain an effect of improving the light extraction efficiency as described in Japanese Patent Application Laid-Open No. 2006-156390, sufficient protection performance may not be obtained because the protective layer is too thin.

SUMMARY OF THE INVENTION

An object of the present invention is to provide an organic EL device which includes an inorganic protective layer having sufficient device protection performance and high light extraction efficiency and which is excellent in water resistance, acid resistance, and mechanical strength, and a multi-color display apparatus using the organic EL device.

According to the present invention, there is provided an organic electroluminescence device, including: a first electrode; a second electrode; an organic compound layer which is provided between the first electrode and the second electrode and includes an emission layer; and a first inorganic protective layer on the second electrode, in which a thickness of the first inorganic protective layer satisfies:

$$[\{(2m+1)/4\}-(1/8)]\lambda < nd < [\{(2m+1)/4\}+(1/8)]\lambda$$

where d indicates the thickness of the first inorganic protective layer, n indicates a refractive index of the first inorganic protective layer, λ indicates a maximum peak wavelength of a spectrum of light emitted from the organic electroluminescence device, and m indicates a natural number.

According to the present invention, the thickness of the inorganic protective layer is defined based on a light emitting wavelength to further improve a microcavity of the EL device. Therefore, when the inorganic protective layer which is excellent in moisture resistance, acid resistance, and mechanical strength is used, there may be provided the organic EL device having high reliability and excellent light extraction efficiency, and the multi-color display apparatus using the organic EL device.

Further features of the present invention will become apparent from the following description of exemplary embodiments with reference to the attached drawings.

DESCRIPTION OF THE EMBODIMENTS

An organic EL device according to the present invention includes a first electrode, a second electrode, an organic compound layer which is located between the first electrode and the second electrode and includes an emission layer, and an inorganic protective layer which is in contact with the second electrode and provided on a side opposite to the first electrode side. A thickness of the inorganic protective layer satisfies:

$$[\{(2m+1)/4\}-(1/8)]\lambda < nd < [\{(2m+1)/4\}+(1/8)]\lambda$$

where d indicates the thickness of the inorganic protective layer, n indicates a refractive index of the inorganic protective layer, λ indicates a maximum peak wavelength of a spectrum of light emitted from the organic electroluminescence device, and m indicates a natural number.

Figure 1:
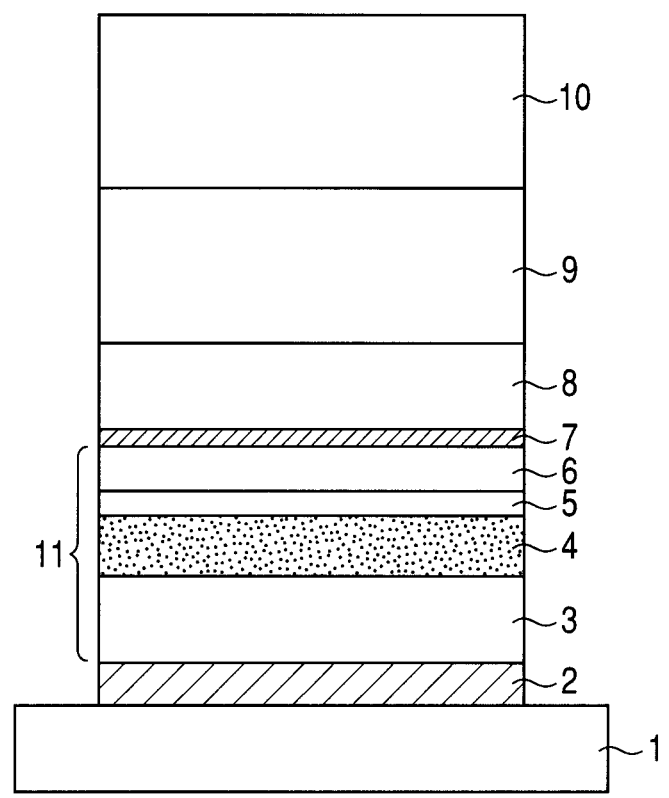
FIG. 1 is a schematic cross sectional view illustrating an organic EL device according to a preferred embodiment of the present invention.

Hereinafter, the organic EL device according to the present invention is described with reference to FIG. 1 illustrating a schematic cross sectional view of an embodiment. The organic EL device illustrated in FIG. 1 has a top emission type structure in which a reflective electrode 2, a hole transport layer 3, an emission layer 4, an electron transport layer 5, an electron injection layer 6, a translucent electrode 7, a first inorganic protective layer 8, a coverage layer 9, and a second inorganic protective layer 10 are provided in this order on a substrate 1. In this embodiment, the layers from the hole transport layer 3 to the electron injection layer 6 constitute an organic compound layer 11. The reflective electrode 2 corresponds to the first electrode in the present invention. The translucent electrode 7 located on a light extraction side corresponds to the second electrode in the present invention. In the organic EL device, a voltage is applied between the reflective electrode 2 and the translucent electrode 7 to supply a current to the organic compound layer 11. Therefore, holes and electrons which are injected from the respective electrodes are recombined in the emission layer 4 to emit light. The reflective electrode is an electrode in which a reflectance on a surface thereof in a visible light range (400 nm to 780 nm in wavelength) is equal to or larger than 50%. The translucent electrode is an electrode in which the reflectance in the visible light range is equal to or larger than 40%.

An organic EL device generally has a microcavity in which emitted light is resonated at a wavelength corresponding to an optical distance between the reflective electrode and the translucent electrode. A microcavity relationship is expressed by the following Relational Expression (1) including phase shifts. Each of a phase shift amount φ1 on the reflective electrode and a phase shift amount φ2 on the translucent electrode is normally n. Therefore, when the optical distance between the reflective electrode and the translucent electrode is set to an integral multiple of approximately ½ of the wavelength, a microcavity relationship in which light beams reflected between the reflective electrode and the translucent electrode enhance one another is obtained. Thus, light extraction efficiency is improved.

$$2D/\lambda + ((\phi_1 + \phi_2)/2\pi) = N \quad (1)$$

D: optical distance between reflective electrode and translucent electrode
$\lambda$: EL light emitting wavelength
$\phi_1$: phase shift amount (radian) on reflective electrode
$\phi_2$: phase shift amount (radian) on translucent electrode
N: integer In a case of an actual organic EL device, a viewing angle property which is in a trade-off relationship with front extraction efficiency is taken into account, and hence it is not necessary to set exactly the same thickness as described above.

Respective portions of the organic EL device according to the present invention are described in detail. The organic EL device fundamentally includes an emission layer between a pair of electrodes. In order to efficiently recombine holes and electrons in the emission layer, the hole transport layer 3, the electron transport layer 5, the electron injection layer 6, and a hole injection layer (not shown) are desirably provided. If provided, the hole injection layer is provided between the anode and the hole transport layer or the emission layer. The thicknesses of the layers may be set to form the microcavity as described above or to reduce power consumption.

The substrate 1 to be used is normally a glass substrate. The reflective electrode 2 is desirably made of aluminum, silver, or an alloy thereof. A thickness of the reflective electrode is desirably in a range of 50 nm to 300 nm.

The hole transport layer 3 serves to perform hole injection and hole transport from the anode (reflective electrode 2 in this embodiment). If necessary, a hole injection layer (not shown) made of copper phthalocyanine or vanadium oxide may be formed between the anode and the hole transport layer 3. Each of the hole transport layer 3 and the hole injection layer is made of low-molecular and high-molecular materials having hole injection/transport performance. Examples of such material include triphenyldiamine derivatives, oxadiazole derivatives, polyphilyl derivatives, stilbene derivatives, poly(vinylcarbazole), poly(thiophene), and other conductive polymers, but are not limited thereto.

Any known light emitting material may be suitably used for the emission layer 4. The light emitting material may be a single material serving as the emission layer 4 or may be a material to be used as a mixed layer containing a host material and a light emitting dopant or a charge transport dopant.

A known material, for example, an aluminum-quinolinol complex or a phenanthroline compound may be used for the electron transport layer 5. If necessary, a hole blocking layer of which an absolute value of the highest occupied molecular orbit (HOMO) energy is large may be formed between the emission layer 4 and the electron transport layer 5.

For the electron injection layer 6, there can be used a thin film (having a thickness of 5 to 10 Å) formed of an alkali (alkaline earth) metal or an alkali (alkaline earth) metal compound. For example, lithium fluoride (LiF), potassium fluoride (KF), or magnesium oxide (MgO) is preferred.

For the semi-transparent electrode 7, there can be used gold, platinum, silver, aluminum, chromium, magnesium, or an alloy thereof in a form of thin film. In particular, a silver thin film or a silver alloy thin film, which is high in conductivity and reflectance, is desirably used. A thickness of the translucent electrode 7 is desirably 5 nm or more to 20 nm or less.

In the present invention, the inorganic protective layer 8 is provided in contact with the translucent electrode 7 which is an upper electrode, and an optical thickness of the inorganic protective layer 8 is defined. The coverage layer 9 and/or the second inorganic protective layer 10 are/is desirably provided on the inorganic protective layer 8 as the first inorganic protective layer. Each of the first inorganic protective layer 8 and the second inorganic protective layer 10 is an inorganic film made of, for example, silicon nitride (SiN), silicon oxide ($SiO_2$), indium tin oxide (ITO), or indium zinc oxide ($In_2O_3$—ZnO). When a sputtering method or a CVD method is used, a dense film which has high moisture resistance may be formed as the inorganic film. In contrast to this, the coverage layer 9 is made of a heat or light curable resin, for example, epoxy resin.

In the present invention, an optical thickness ((refractive index)$_\lambda$(thickness)) of the first inorganic protective layer 8 is approximately $(2m+1)/4$ (m is natural number) times a maximum peak wavelength (hereinafter referred to as light emitting wavelength) of a spectrum of light emitted from the organic electroluminescence device. To be more specific, assume that "n" indicates the refractive index of the inorganic protective layer, $\lambda$ indicates the maximum peak wavelength of the spectrum of light emitted from the organic electroluminescence device, and "m" indicates the natural number. In this case, a thickness "d" of the inorganic protective layer satisfies the following Relational Expression (2).

$$[\{(2m+1)/4\} - (1/8)]\lambda < nd < [\{(2m+1)/4\} + (1/8)]\lambda \quad (2)$$

The thickness "d" of the inorganic protective layer more desirably satisfies the following Relational Expression (2a).

$$[\{(2m+1)/4\} - (1/16)]\lambda < nd < [\{(2m+1)/4\} + (1/16)]\lambda \quad (2a)$$

The thickness "d" of the inorganic protective layer is optimally $(2m+1)\lambda/4$.

When the thickness as described above is set, the following relationship is obtained. That is, light which is reflected at an interface between the first inorganic protective layer 8 and the coverage layer 9 and returns to the organic compound layer 11 side is in phase with light which is reflected on the translucent electrode 7 and returns to the organic compound layer 11 side. Therefore, the microcavity in the present invention may be further improved. In another method of improving the microcavity, the optical thickness nd of the first inorganic protective layer 8 may be set to approximately ¼$\lambda$. However, in this case, the first inorganic protective layer 8 becomes thinner and thus loses a function as the inorganic protective layer. For example, when a SiN layer which is a normal inorganic film is used as the first inorganic protective layer, a refractive index of the SiN layer is 2.0, a maximum peak wavelength of a spectrum of light emitted from a blue organic EL device having the shortest wavelength is 460 nm, and hence the thickness is reduced to approximately 58 nm when "nd=¼$\lambda$". Such a thin film has an insufficient function as the first inorganic protective layer 8 and a blocking layer for intrinsic moisture in the coverage layer 9. In contrast to this, the thickness which is approximately $(2m+1)/4$ times the light emitting wavelength is equal to or larger than 174 nm, and hence the thin film sufficiently serves as the first inorganic protective layer 8 in the present invention.

The order of the optical thickness of the first inorganic protective layer 8 may be increased from approximately ¾ times (m=1) the light emitting wavelength to approximately 5/4 times (m=2) and approximately 7/4 times (m=3) in order.

However, a problem on light absorption and material consumption due to an increase in thickness occurs. A problem that a formation time lengthens also occurs. Therefore, the optical thickness of the first inorganic protective layer 8 is desirably approximately ¾ times (m=1) the light emitting wavelength, that is, the natural number "m" is desirably 1.

In the present invention, the first inorganic protective layer 8 is provided to obtain a device protection effect. In order to further improve the device protection effect, the second inorganic protective layer 10 is desirably provided on the formed coverage layer 9. In the present invention, the thick resin film is formed as the coverage layer 9 under the second inorganic protective layer 10, and hence the second inorganic protective layer 10 may be prevented from causing defects by unevenness of foreign substances. Another method of preventing the defects caused by the foreign substances is to thicken the second inorganic protective layer 10. Particles which are normal foreign substances are several μm in size. Therefore, when a thickness of several ten μm is set by using a sputtering method or a CVD method to cover the unevenness, a tact time lengthens to increase a cost. In contrast to this, the coverage layer 9 is formed as the resin film for which an application process may be employed, and hence the coverage layer 9 which is the thick film may be easily formed. The coverage layer 9 formed as the resin film is desirably provided at a thickness to sufficiently cover particles of several μm, for example, a thickness of 5 μm or more to 50 μm or less. The second inorganic protective layer 10 formed as the inorganic film is desirably provided at a thickness capable of sufficiently preventing moisture from entering, for example, a thickness of 0.5 μm or more to 3 μm or less.

In the present invention, the first inorganic protective layer 8 is formed under the coverage layer 9. Therefore, even when the coverage layer 9 is the thick film, the film may be prevented from peeling by stress when the resin is cured. When the first inorganic protective layer 8 is formed as the dense inorganic film, monomers or solvents may be prevented from entering the organic compound layer in the case where the coverage layer 9 is formed, and the organic compound layer may be prevented from being degraded by intrinsic moisture contained in the coverage layer 9. The first inorganic protective layer 8 in the present invention also serves to reduce the stress of the resin of the coverage layer 9 and protect the device during a printing process.

In the present invention, when the coverage layer 9 and the second inorganic protective layer 10 are provided, the thickness of the second inorganic protective layer 10 is desirably set to a thickness determined in view of optical interference.

Figure 2:
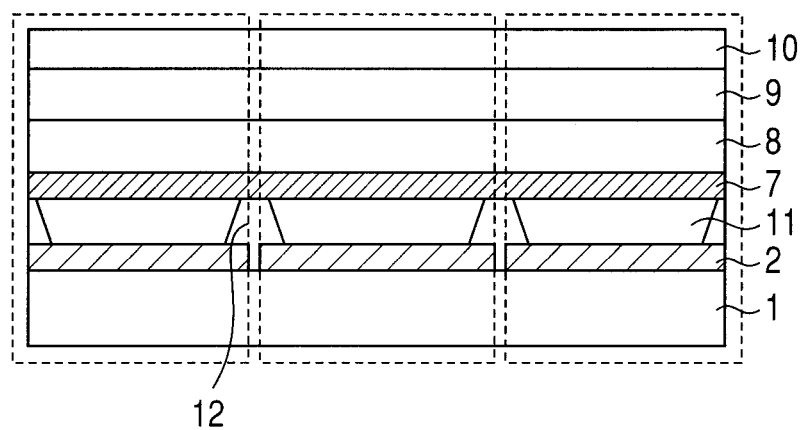
FIG. 2 is a schematic cross sectional view illustrating a multi-color display apparatus according to the preferred embodiment of the present invention.

FIG. 2 is a schematic cross sectional view illustrating a multi-color display apparatus according to the present invention. In FIG. 2, each of regions surrounded by broken lines corresponds to the organic EL device illustrated in FIG. 1. Partition walls 12 are provided to separate the organic EL devices from one another.

In the multi-color (at least two-color) display apparatus in which the plurality of organic EL devices are arranged, the first inorganic protective layer 8 may be patterned corresponding to light emission colors of the organic EL devices. For process simplicity, the first inorganic protective layer 8 is desirably provided as a common layer at the same thickness $d_1$. In this case, the thickness $d_1$ desirably satisfies Relational Expressions (2) or (2$a$) with respect to the maximum peak wavelength λ of a spectrum of light emitted from an organic EL device of which light emitting efficiency and life property are the poorest. That is, assume that $n_1$ indicates a refractive index of the inorganic protective layer 8 which is in contact with the cathode, $\lambda_1$ indicates the maximum peak wavelength of the spectrum of light emitted from the organic EL device of which light emitting efficiency is the lowest (life property is the poorest), and $m_1$ indicates the natural number. In this case, the thickness $d_1$ desirably satisfies the following Expression (3).

$$[\{(2m_1+1)/4\}-(1/8)]\lambda_1 < n_1 d_1 < [\{(2m_1+1)/4\}+(1/8)]\lambda_1 \quad (3)$$

The thickness $d_1$ desirably satisfies the following Expression (3a).

$$[\{(2m_1+1)/4\}-(1/16)]\lambda_1 < n_1 d_1 < [\{(2m_1+1)/4\}+(1/16)]\lambda_1 \quad (3a)$$

The thickness $d_1$ is optimally $(2m_1+1)\lambda_1/4$.

In the present invention, in order to enhance light reflected at the interface between the first inorganic protective layer 8 and the coverage layer 9, it is effective to maximize a refractive index difference at the interface between the first inorganic protective layer 8 and the coverage layer 9. A refractive index of a normal resin is approximately 1.6. In contrast to this, a refractive index of SiN of a normal inorganic film is approximately 2.0, a refractive index of $SiO_2$ is approximately 1.5, and a refractive index of $TiO_2$ is approximately 2.5. Therefore, the first inorganic protective layer 8 is made of desirably SiN rather than $SiO_2$, more desirably $TiO_2$. In a structure in which the coverage layer 9 and the second inorganic protective layer 10 are not provided on the first inorganic protective layer 8, an interface opposed to the second electrode (translucent electrode 7) side of the first inorganic protective layer 8 is an interface between the first inorganic protective layer 8 and air. A refractive index of air is approximately 1.0, and hence a refractive index difference between the first inorganic protective layer 8 and air is larger than the refractive index difference between the first inorganic protective layer 8 and the coverage layer 9. Thus, in the structure, a reflectance at the interface opposed to the second electrode side of the first inorganic protective layer 8 is large, and hence the light extraction efficiency is improved.

In this embodiment, the structure in which the reflective electrode 2 located on the substrate 1 is the anode is described. However, the present invention is not limited to this structure. A structure may be employed in which the reflective electrode (cathode) 2, the electron injection layer 6, the emission layer 4, the hole transport layer 3, the translucent electrode (anode) 7, the first inorganic protective layer 8, the coverage layer 9, and the second inorganic protective layer 10 may be provided in this order from the substrate 1 side.

EXAMPLE 1

The organic EL device having the structure illustrated in FIG. 1 was manufactured by the following method.

An aluminum alloy (AlNd) film was formed as the reflective electrode 2 on the glass substrate 1 serving as a support member at a thickness of 100 nm by a sputtering method. Then, an ITO film was formed at a thickness of 70 nm by a sputtering method. Next, a pixel separation film made of polyimide was formed at a height of 1 μm and at a taper angle of 40°. The resultant substrate was sequentially subjected to ultrasonic cleaning in acetone and isopropyl alcohol (IPA). After that, the substrate was washed in boiling IPA and dried. The surface of the substrate was further subjected to UV/ozone cleaning.

A film of N,N'-diphenyl-N,N'-di(3-methylphenyl)-1,1'-biphenyl-4,4'-diamine (TPD) was formed on the substrate 1 at a thickness of 50 nm to obtain the hole transport layer 3. Next, the emission layer 4 having a thickness of 25 nm was formed by co-evaporation (at weight ratio of 95:5) of tris(8-quinolinolato)aluminum (Alq3) and 4,4'-bis(2,2-diphenylethen-1- yl)biphenyl (DPVBi). Then, a film of Alq3 was formed on the emission layer 4 at a thickness of 20 nm to obtain the electron transport layer 5.

Next, the electron injection layer 6 was formed at a thickness of 15 nm by co-evaporation of bathophenanthroline and cesium carbonate so that a cesium concentration in the layer was 8.3 weight %. A film of silver (Ag) was formed on the electron injection layer 6 by a heating evaporation method to obtain the translucent electrode 7 having a thickness of 12 nm.

Next, a sealing structure in which the first inorganic protective layer 8, the coverage layer 9, and the second inorganic protective layer 10 are laminated was formed on the translucent electrode 7. First, a SiN film was formed on the translucent electrode 7 by a CVD method to obtain the first inorganic protective layer 8 having a thickness of 180 nm. Then, an epoxy resin film was formed on the first inorganic protective layer 8 by an application process and heat curing to obtain the coverage layer 9 having a thickness of 30 µm. Finally, a SiN film was formed on the coverage layer 9 by a CVD method to obtain the second inorganic protective layer 10 having a thickness of 1 µm.

The light emitting wavelength $\lambda$ of the organic EL device is equal to 460 nm and the refractive index "n" of the first inorganic protective layer 8 (SiN) is equal to 2.0, and hence Relational Expression (2) becomes $143.75 \leq d \leq 201.25$ in a case where m=1. Therefore, the thickness "d" of the first inorganic protective layer 8 of the organic EL device according to this example is within the range defined in the present invention. As a result, the following relationship is obtained. That is, light which is reflected at the interface between the first inorganic protective layer and the coverage layer and returns to the organic compound layer side is in phase with light which is reflected on the translucent electrode and returns to the organic compound layer side. Thus, the microcavity is further improved. The first inorganic protective layer 8, the coverage layer 9, and the second inorganic protective layer 10 have sufficient thicknesses, and hence degradation resulting from moisture, for example, dark spot was not observed.

When the thickness of the first inorganic protective layer 8 of the organic EL device according to this example is set to $(\frac{1}{8})\lambda$ (that is, approximately 58 nm), the light extraction efficiency is almost not changed.

However, when the thickness becomes thinner, there was a case where the first inorganic protective layer does not sufficiently serve to reduce stress and thus film peeling occurs. In addition, there was a case where a thickness sufficient to block intrinsic moisture contained in the resin of the coverage layer 9 is not ensured and thus dark spots occur with time.

EXAMPLE 2

A $TiO_2$ film having a thickness of 140 nm was formed as the first inorganic protective layer 8 by a sputtering method. Next, an epoxy resin film having a thickness of 30 µm was formed as the coverage layer on the first inorganic protective layer 8 by an application process and heat curing. Then, a SiN layer having a thickness of 1 µm was formed as the second inorganic protective layer 10 by a CVD method. The other processes were performed as in the case of Example 1 to manufacture the organic EL device.

The light emitting wavelength $\lambda$ of the organic EL device is equal to 460 nm and the refractive index "n" of the first inorganic protective layer 8 ($TiO_2$) is equal to 2.5, and hence Relational Expression (2) becomes $115 \leq d \leq 161$ in a case where m=1. Therefore, the thickness "d" of the first inorganic protective layer 8 of the organic EL device according to this example is within the range defined in the present invention.

As a result, the following relationship is obtained. That is, light which is reflected at the interface between the first inorganic protective layer and the coverage layer and returns to the organic compound layer 11 side is in phase with light which is reflected on the translucent electrode and returns to the organic compound layer 11 side. Thus, the microcavity is further improved. The first inorganic protective layer 8, the coverage layer 9, and the second inorganic protective layer 10 have sufficient thicknesses, and hence degradation resulting from moisture, for example, dark spot was not observed.

In Example 1, the refractive index difference between the first inorganic protective layer 8 and the coverage layer 9 is 0.4 (because refractive index of resin is 1.6 and refractive index of SiN is 2.0). In contrast to this, the refractive index difference in this example is 0.9 (because refractive index of resin is 1.6 and refractive index of $TiO_2$ is 2.5) and larger than the refractive index difference in Example 1. Therefore, the microcavity is further improved. Thus, the efficiency was improved by 1.08 times as compared with Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-261748, filed on Nov. 17, 2009, which is hereby incorporated by reference herein in its entirety.

What is claimed is:

1. An organic electroluminescence device comprising:
   a first electrode;
   a second electrode located on a light extraction side and comprising a metal film;
   an organic compound layer provided between the first electrode and the second electrode and including an emission layer; and
   a first inorganic protective layer in direct contact with the second electrode,
   a coverage layer made of a resin, which is provided on the first inorganic protective layer,
   a difference between a refractive index of the first inorganic protective layer and that of the coverage layer is 0.4 or more,
   wherein a thickness of the first inorganic protective layer satisfies:

$[\{(2m+1)/4\}-(\frac{1}{8})]\lambda < nd < [\{(2m+1)/4\}+(\frac{1}{8})]\lambda,$ where d indicates the thickness of the first inorganic protective layer, n indicates a refractive index of the first inorganic protective layer, $\lambda$ indicates a maximum peak wavelength of a spectrum of light emitted from the organic electroluminescence device, and m indicates a natural number, and
   wherein a distance between the first electrode and the second electrode satisfies:

$2D/\lambda + (\phi 1 + \phi 2)/2\pi = N$ where D indicates an optical distance between the first electrode and the second electrode, $\lambda$ indicates an electroluminescence light emitting wavelength, $\phi 1$ indicates a phase shift amount on the first electrode, $\phi 2$ indicates a phase shift amount on the second electrode, and N indicates an integer.

2. The organic electroluminescence device according to claim 1, wherein the first inorganic protective layer comprises one of SiN and $TiO_2$.

3. The organic electroluminescence device according to claim 2, wherein the natural number m is 1.

4. The organic electroluminescence device according to claim 1, wherein the thickness of the coverage layer is 5 μm or more to 50 μm or less.

5. The organic electroluminescence device according to claim 1, further comprising a second inorganic protective layer which is different from the first inorganic protective layer and which is disposed on the coverage layer and which has a thickness of 0.5 μm or more to 3 μm or less.

6. An apparatus comprising a plurality of organic electroluminescence devices each of which is defined in claim 1, wherein the plurality of organic electroluminescence devices comprise the first inorganic protective layer as a common layer.

7. The apparatus according to claim 6, wherein each of the plurality of organic electroluminescence devices emits light having a different wavelength, respectively, and wherein a thickness of the first inorganic protective layer commonly provided to the plurality of organic electroluminescence devices is a thickness such that when a maximum peak wavelength of a spectrum of light emitted from the organic electroluminescence device of which light emitting efficiency is the lowest satisfies:

$$[\{(2m+1)/4\}-(1/8)]\lambda < nd < [\{(2m+1)/4\}+(1/8)]\lambda.$$

8. The organic electroluminescence device according to claim 1, wherein the first inorganic protective layer comprises $TiO_2$.

* * * * *